US006397077B1

(12) United States Patent
Jensen

(10) Patent No.: US 6,397,077 B1
(45) Date of Patent: May 28, 2002

(54) WIDE FREQUENCY RANGE COUPLERS AND DETECTORS FOR POWER DETECTION IN MULTIPLE FREQUENCY BAND SYSTEMS

(75) Inventor: Niels J. Jensen, Laguna Niguel, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/081,702

(22) Filed: May 20, 1998

(51) Int. Cl.[7] .............................................. H04B 17/00
(52) U.S. Cl. ...................... 455/553; 455/550; 455/551; 455/552; 455/571; 455/575
(58) Field of Search ................................ 455/550, 552, 455/553, 127, 575, 126, 571

(56) References Cited

U.S. PATENT DOCUMENTS

| 5,732,330 A | * | 3/1998 | Anderson et al. | ............. 455/76 |
| 5,794,159 A | * | 8/1998 | Portin | ......................... 455/553 |
| 5,812,941 A | | 9/1998 | Cho | |
| 5,884,149 A | * | 3/1999 | Jaakola | ....................... 455/103 |
| 5,887,020 A | * | 3/1999 | Smith et al. | ................ 375/200 |

FOREIGN PATENT DOCUMENTS

| EP | 0 592 034 A2 | 4/1994 |
| EP | 0675 605 A2 | 10/1995 |
| EP | 0859 464 A2 | 8/1998 |
| JP | 09284216 | 10/1997 |

OTHER PUBLICATIONS

A Method of Analysis and Design of Microstrip Directional Couplers Considering Dispersion and Discontinuity Effects, Sep. 21, 1979, pp. 299–303, XP–002126225.

Synthesis, Design, and Construction of Ultra–Wide–Band Nonuniform Quadrature Directional Couplers in Inhomogeneous Media, vol. 37, No. 6, p. 969–976, XP000046961.

* cited by examiner

Primary Examiner—Daniel Hunter
Assistant Examiner—Alan T. Gantt
(74) Attorney, Agent, or Firm—Thomas, Kayden, Horstemeyer & Risley, L.L.P.

(57) ABSTRACT

A multiband phone capable of transmitting a signal within a plurality of distinct frequency bands having a single wide frequency range power detecting device capable of measuring the power of the transmitted signal over all of the plurality of frequency bands. The multiband phone includes multiple power amplifiers, where each power amplifier amplifies the power of a signal transmitted within a different frequency band. A power amplifier controller is provided for controlling the amount of amplification performed by the power amplifiers, where a switching device switches the connection of the power amplifier controller to a selected power amplifier. The single wide frequency range power detecting device is connected to the output of the all of the power amplifiers through a switching device, where the switching device connects the power detecting device to the particular power amplifier selected for transmission. The power detector then measures the power of the signal transmitted and feeds the measured power back to the power amplifier controller. The power amplifier controller may then adjust the voltage driving the power amplifier connected thereto based upon any difference detected between the desired output power and the measured output power. The performance of the wide frequency range power detecting device is adjusted for the specific transmission frequencies utilized by the multiband phone in order to achieve optimal power detection sensitivity over all of the multiple frequencies.

17 Claims, 3 Drawing Sheets

WIDE FREQUENCY RANGE COUPLERS AND DETECTORS FOR POWER DETECTION IN MULTIPLE FREQUENCY BAND SYSTEMS

BACKGROUND OF THE INVENTION

1. Field of the Invention

The present invention relates generally to power detection in a multiple frequency band transmission system, and specifically to a single wide frequency range coupler and detector pair for detecting the transmitted power of a multiband telephone.

2. Description of Related Art

Mobile phones have recently gained widespread use throughout the world. Mobiles phones communicate with a base station serving a predetermined area or cell. Each base station has a limited bandwidth within which to operate, depending upon the particular transmission technique utilized by the base station. This limited bandwidth is separated into a plurality of channels frequency-spaced evenly from one another, where these channels are used by the mobile phones within that base station's transmission area. Each base station may only handle a limited number of phones equal to the number of channels and time-slots on those channels provided by that base station. Therefore, the frequency spacing between channels is minimized in order to maximize the number of channels supported by the operating bandwidth of the base stations.

In order to prevent interference between signals on two adjacent channels, the power levels of the signals transmitted by the phones must be precisely controlled. As the mobile phones move around within a base station's cell, the power levels received at the base station will change. For instance, the power level received at the base station will increase as the phone moves closer to the base station if the signal continues to be transmitted at the same power level. Interference between adjacent channels will occur if the power level of a signal received at the base station from one of the phones is too large. Therefore, the systems must constantly monitor and adjust the transmission power levels as the phones move within a base station's cell to avoid interference between channels. Each phone includes a power amplifier controller (PAC) which controls a power amplifier for the transmitted signal. The PAC in each phone adjusts the transmitted power level to maintain a minimum interference between the signals received at the base station on all channels at a constant level. A certain amount of error correction is transmitted with each signal by the system, wherein the amount of error correction is predetermined based upon the constant interference level.

The capacity of base stations in highly populated areas can become saturated during time periods of high use. Mobile phones currently operate as single band phones, where the transmitted signal frequency is within the bandwidth of a base station operating on the same transmission method as the mobile phone. There is a need for mobile phones to operate with dual band transmissions to increase system capacity, so that the systems could choose between two transmission frequencies depending upon which bandwidth is less saturated and could achieve a better signal quality. A dualband phone requires two transmitters, one for each frequency band. Since the power levels of the signals transmitted by a mobile phone must be constantly monitored and adjusted, dualband mobile phones must also include a power detector for each transmitter. However, requiring two power detectors in a dualband phone adds to the cost, complexity, and size of the dualband phone. Most mobile phones are designed to be lightweight and portable, so that they may be easily carried on the person using the mobile phone, such as in their pocket or purse. It is therefore critical to design a mobile phone to be as small as possible, thus requiring the number of components to be minimized.

There is a need for a multiband system which selects between one of the possible frequency bands at which to transmit a signal based upon the strength and quality of the transmitted signal received at a base station. Moreover, there is a need for a multiband phone having a single power detector to detect the power level of the transmitted signal at multiple possible frequency bands, regardless of which frequency band is selected for transmission.

OBJECTS AND SUMMARY OF THE INVENTION

It is a primary object of the present invention to overcome the aforementioned shortcomings associated with the prior art.

Another object of the present invention is to provide a multiband phone which selects between one of a plurality of frequency bands to transmit a signal based upon the strength and quality of the transmitted signal received at a base station.

Yet another object of the present invention is to provide a multiband phone having a wide frequency range coupler and detector pair for measuring the power of the transmitted signal, regardless of which frequency band is selected for transmission.

A further object of the present invention is to provide a wide frequency range coupler and detector pair whose design parameters are adjusted to provide the optimal balance for power detection between the various individual frequencies transmitted by the multiband phone.

These as well as additional objects and advantages of the present invention are achieved by providing a multiband phone having multiple transmitters, each transmitter capable of transmitting a signal in a different frequency band. The multiband phone includes multiple power amplifiers, where each power amplifier amplifies the power of a signal transmitted at a different frequency band. A power amplifier controller is provided for controlling the amount of amplification performed by the power amplifiers. A power amplifier switching device is connected to the power amplifier controller for switching the connection of the power amplifier controller between the multiple power amplifiers, so that only one of the power amplifiers is connected to the power amplifier controller at one time. The multiband phone further includes a processing device which monitors the quality and strength of the received signal transmitted by various base stations in the transmission region of the multiband phone. The base stations also monitor the quality and strength of the signals they receive from the multiband phone. The base stations instruct the processing device to control the power amplifier switching device to switch its connection between the power amplifiers based upon a determination of which frequency band provides the optimal balance between signal quality and signal strength, and the multiband phone then transmits within the selected frequency band.

The processing device includes a stored predetermined relationship between signal strength and a voltage driving the power amplifiers, where the processing device instructs the power amplifier controller to adjust the voltage driving the connected power amplifier according to the desired signal strength. The system monitors the quality and strength of the received signal during each duty cycle and the system selects which one of the multiple power amplifiers should be connected to the power amplifier controller for each duty cycle.

The multiband phone also includes a single power sensing device connected to the output of the all of the power amplifiers through a switching device, where the switching device connects the power sensing device to the particular power amplifier selected for transmission. The power sensing device then measures the power of the signal transmitted, and the measured power of the transmitted signal is fed back to the power amplifier controller. The power amplifier controller adjusts the voltage driving the power amplifier connected thereto based upon any difference detected between the desired power output by the connected power amplifier and the measured power of the signal output by the connected power.

The power sensing device includes a wide frequency range directional coupler and a wide frequency power detector capable of effectively measuring the power of any of the desired frequencies selected for transmission by the multiband phone. The performance of the wide frequency range coupler and power detector is adjusted for the specific transmission frequencies utilized by the multiband phone to provide desired performance characteristics over all of the multiple frequency bands. This enables a single power detector to be used for the multiple frequency bands capable of being transmitted by the multiband phone.

The multiband phone further includes a transmitting antenna connected to the output of the power amplifiers. The design parameters of the directional coupler are chosen such that a maximum isolation is provided between the detector and the antenna to minimize signals reflected back from the antenna. Thus, the measured output power signal fed back to the power amplifier controller will only be indicative of the power of the signal transmitted to the antenna and will not include any extraneous signals reflected from the transmitting antenna.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings in which the reference numerals designate like parts throughout the figures thereof and wherein:

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide a system for monitoring the power of a transmitted signal in a multiband telephone using a single power detector.

Figure 1:
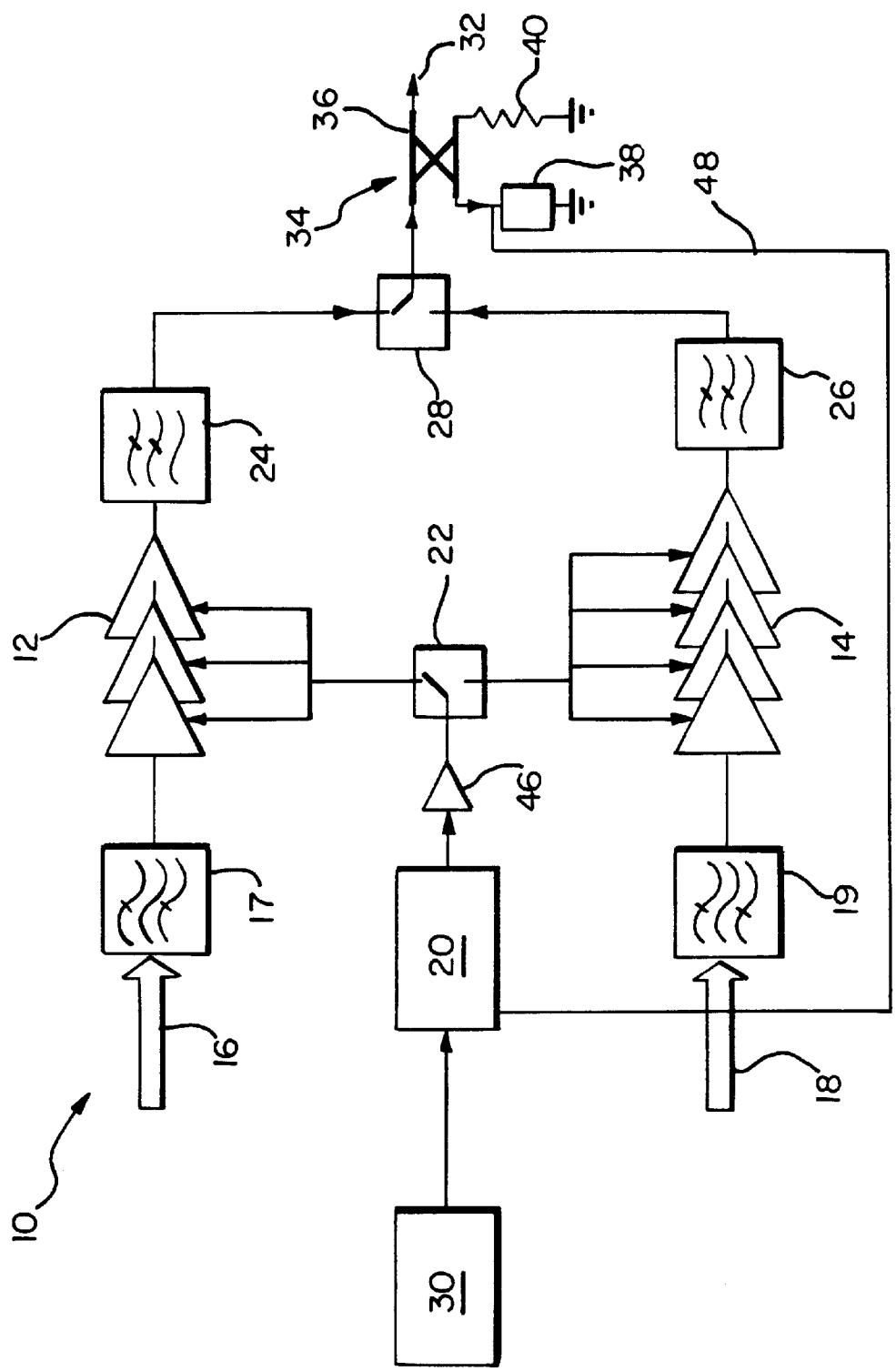
FIG. 1 is a schematic illustration of a preferred embodiment of a system for detecting and controlling the power of signal transmitted from a multiband phone in accordance with a preferred embodiment of the present invention.

Referring now to FIG. 1, a schematic illustration of the system 10 for monitoring and controlling the power of a signal transmitted from a multiband phone of the present invention is shown. The multiband power amplifier control system 10 of the present invention is illustrated as and will be described hereinafter for use in controlling the transmitters in a dualband phone. However, it is understood that the multiband power amplifier control system 10 may be implemented in a phone capable of transmitting any number of frequencies or in any similar device which transmits information from a mobile device to a base station, such as mobile modems or mobile fax machines.

The multiband power amplifier control system 10 includes two power amplifiers 12 and 14, where power amplifier 12 amplifies the power of a signal 16 to be transmitted at a first frequency band while power amplifier 14 amplifies the power of signal 18 to be transmitted at a second different frequency band. Signals 16 and 18 are passed through bandpass filters 17 and 19, respectively, prior to being fed to their respective power amplifier. A power amplifier controller 20 is provided for controlling the amount of amplification performed by power amplifiers 12 and 14. A power amplifier switching device 22 is connected to the power amplifier controller 20 for switching the connection of the power amplifier controller 20 between power amplifiers 12 and 14. Therefore, only one of the two power amplifiers 12 and 14 is connected to the power amplifier controller 20 at one time, depending upon the connection established by switching device 22. Switching device 22 may comprise any type of multiple-contact switch that allows its connection between contacts to be easily switched.

The multiband power amplifier control system 10 further includes a processing device 30 which monitors the quality and strength of the received signal transmitted from various base stations within the transmission region of the multiband phone. Processing device 30 may comprise a microprocessor, IC chip, or other similar device used for processing information. The base stations also monitor the quality and strength of the signals they receive from the various multiband phones. The base stations determine which frequency band and which base station provides the optimal balance between signal quality and signal strength based on the quality and strength of the signals they receive from the multiband phones as well as signal information reported from the multiband phones. When the base stations determine that the optimal frequency band or optimal base station is not currently being used, the base stations will then instruct processing device 30 to change its transmission to the optimal frequency band or optimal base station. The processing device 30 then instructs the switching device 22 to switch its connection between the two power amplifiers 12 and 14 based upon a determination of which frequency band provides the optimal balance between signal quality and signal strength. The determination of which frequency band provides the optimal balance between signal quality and signal strength may be determined by the processing device 30 itself from information received from the base stations or the determination may be made by base stations themselves.

The processing device 30 includes a stored predetermined relationship between transmitted signal strength and a voltage driving power amplifiers 12 and 14, where the processing device 30 instructs the power amplifier controller 20 to adjust the voltage driving the connected power amplifier according to the desired signal strength. The power level is precisely controlled to provide a high quality signal without interfering with other channels at the receiving base station. The multiband phone monitors the quality and strength of the received signal for each duty cycle and on command by the base station selects which of the two power amplifiers 12 and 14 should be connected to the power amplifier controller 20 for each duty cycle. For instance, during transmission of a digital signal by a telephone, active transmission only occurs 12.5% of the time with a typical transmission time of 577 $\mu$s. During the inactive period, the telephone has a receiving period and monitoring period where the multiband phone measures the various signal strengths and signal qualities of the transmitted signal received from the various base stations. For each cycle, the signal quality and signal strength from the various base stations is analyzed to determine which base station to transmit to and at which frequency band to transmit. By performing this determination for each duty cycle, optimal transmission of the signal from the telephone is maintained at all times.

Lowpass filters 24 and 26 are positioned at the outputs of power amplifiers 12 and 14, respectively, to only allow signals transmitted below a predetermined frequency to pass there through, where lowpass filter 24 is frequency matched with the signal amplified by power amplifier 12 and lowpass filter 26 is frequency matched with the signal amplified by power amplifier 14. Lowpass filters 24 and 26 are both connected to an antenna switching device 28, such that antenna switching device 28 connects the output from one of the lowpass filters 24 and 26 to a transmitting antenna 32. Antenna switching device 28 operates similarly as power amplifier switching device 22 and also operates in conjunction with power amplifier switching device 22, so that the transmitting antenna 32 is connected with the output of the power amplifier selectively connected to power amplifier controller 20 by power amplifier switching device 22. In an alternative embodiment of the present invention, antenna switching device 28 may be omitted from the multiband power amplifier control system 10, where transmitting antenna 32 is simultaneously connected to the outputs of both power amplifiers 12 and 14. Since processing device 30 instructs the multiband power amplifier control system 10 to transmit only one frequency band at a time, only one of the power amplifiers 12 and 14 will output a signal to be transmitted during each duty cycle. Further, lowpass filters 24 and 26 will prevent unwanted signals output by the power amplifiers 12 and 14 from being radiated by the antenna 32.

The multiband power amplifier control system 10 also includes a wide frequency range power sensing device 34 attached between antenna switching device 28 and antenna 32. Power sensing device 34 measures the actual power of the signal transmitted from the connected power amplifier, regardless of which frequency band is being transmitted. It is understood that any device or power sensing circuit capable of optimally measuring the power over a wide range of transmitted frequencies may be used as power sensing device 34. In a preferred embodiment of the present invention, power sensing device 34 includes a wide frequency range directional coupler 36, a wide frequency range power detector 38, and a resistor 40. Power detector 38 measures the power of the transmitted signal and may comprise any device having wide frequency range power measurement capabilities, such as a diode array. The operation of the various components of the power sensing device 34 are described in greater detail hereinbelow with further reference to the power sensing device 34 illustrated in FIG. 2.

The power of the transmitted signal measured by the power sensing device 34 is fed back to the power amplifier controller 20 in order to provide precise control of the actual power of the signal transmitted from the multiband power amplifier control system 10. As previously described, the power of the transmitted signal must be precisely controlled to avoid interference between channels of a base station. Therefore, it is important to monitor the actual power of the signal transmitted to determine if it varies from the desired transmission power. The power amplifier controller 20 adjusts the voltage driving the power amplifier connected thereto based upon any differences found between the desired power output by the connected power amplifier and the power of the transmitted signal as measured by the power sensing device 34. This enables power amplifier controller 20 to account for variations which may occur in the power amplification procedure of the transmitted signals, such as those variations occurring in the components of the multiband phone as affected by temperature, battery voltage, etc. Further, switching devices 22 and 28 are connected to communicate with the processing device 30, where it is understood that communication between processing device 30 and switching devices 22 and 28 may be established by any means, such as a physical electrical link, a frequency transmission link, or a light transmission link. Switching devices 22 and 28 receive a command transmitted from the processing device 30 which simultaneously controls the connection of switching devices 22 and 28, so that all of the components of the multiband phone are alternatively connected to either power amplifier 12 or power amplifier 14.

Figure 2:
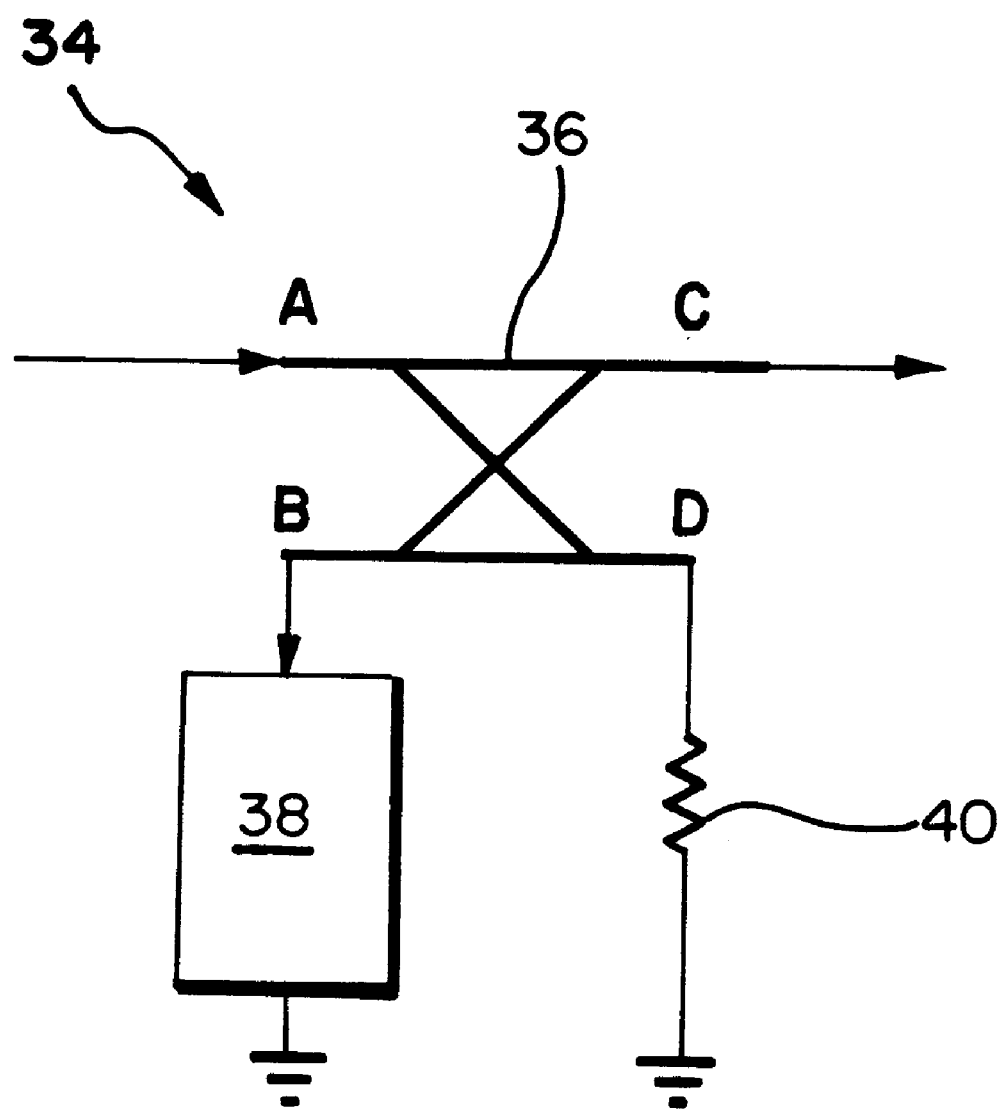
FIG. 2 is an enlarged schematic illustration of the components of the power detector of FIG. 1.

The operation of the power sensing device 34 will now be described with reference to its components illustrated in FIG. 2. Directional coupler 36 is positioned between the transmitting antenna 32 and power detector 38 in order to prevent any signals reflected back from the transmitting antenna 32 from affecting the power measurement by power detector 38. If any error occurs during the transmission of the signal by a defect in transmitting antenna 32, a portion of the signal may be reflected back from the transmitting antenna toward power sensing device 34. Thus, directional coupler 36 assists in preventing the measured power of the transmitted signal which is fed back to power amplifier controller 20 from including any extraneous values from signals reflected back from a defective transmitting antenna 32. This enables more precise control of the power of the signal to be transmitted by providing an accurate value of the measured power of the transmitted signal back to the power amplifier controller.

The directional coupler 36 selects the signal being transmitted in the forward direction toward the transmitting antenna 32 from point A toward point C and allows the forward power, i.e. the power of the signal traveling in the forward direction, to be measured at point B. Thus, the forward power is measured across power detector 38. The reflected power, i.e. the power of any signals reflected from the antenna 32, is selected by directional coupler 36 to be transmitted to point D. The reflected power is then dissipated across resistor 40 connected to ground. Thus, only the forward power of the signal to be transmitted is measured by power detector 38 and fed back to power amplifier controller 20.

Conventionally, power sensors utilizing directional couplers are frequency matched with the frequencies in the transmission frequency band to achieve optimal power sensor sensitivity. A directional coupler will typically be formed with two traces of conductive material, where a capacitance formed between the two traces will serve to allow a detector connected to the second trace to measure the power of a signal transmitted along the first trace. Where the power detector is frequency matched to the transmitted frequency, the traces will typically be a ¼ of the wavelength of the transmitted frequency. This presents a problem when attempting to measure the power over a wide range of frequencies, as in the present invention, since the performance characteristics of the coupler for one frequency band will be different than that of another frequency band. Further, there is an insertion loss between points A and C of the first trace, so the insertion losses would be too great to position a plurality of directional couplers in series with one another with each directional coupler being frequency matched with a particular transmission frequency.

Thus, the inventor of the present invention has developed a wide frequency range power sensing device 34 capable of accurately measuring the power over a wide range of frequencies, while varying the parameters of the power sensing device 34 so that the insertion loss is optimized for the various transmission frequency bands. A directional coupler 36 having optimal performance characteristics will possess the following: (1) a minimal insertion loss between points A and C; (2) forward power of the transmitted signal will travel between points A and B within a specified level; and (3) isolation between points B and C will be maximal in order to minimize the amount of reflected power reaching point B.

Figure 3:
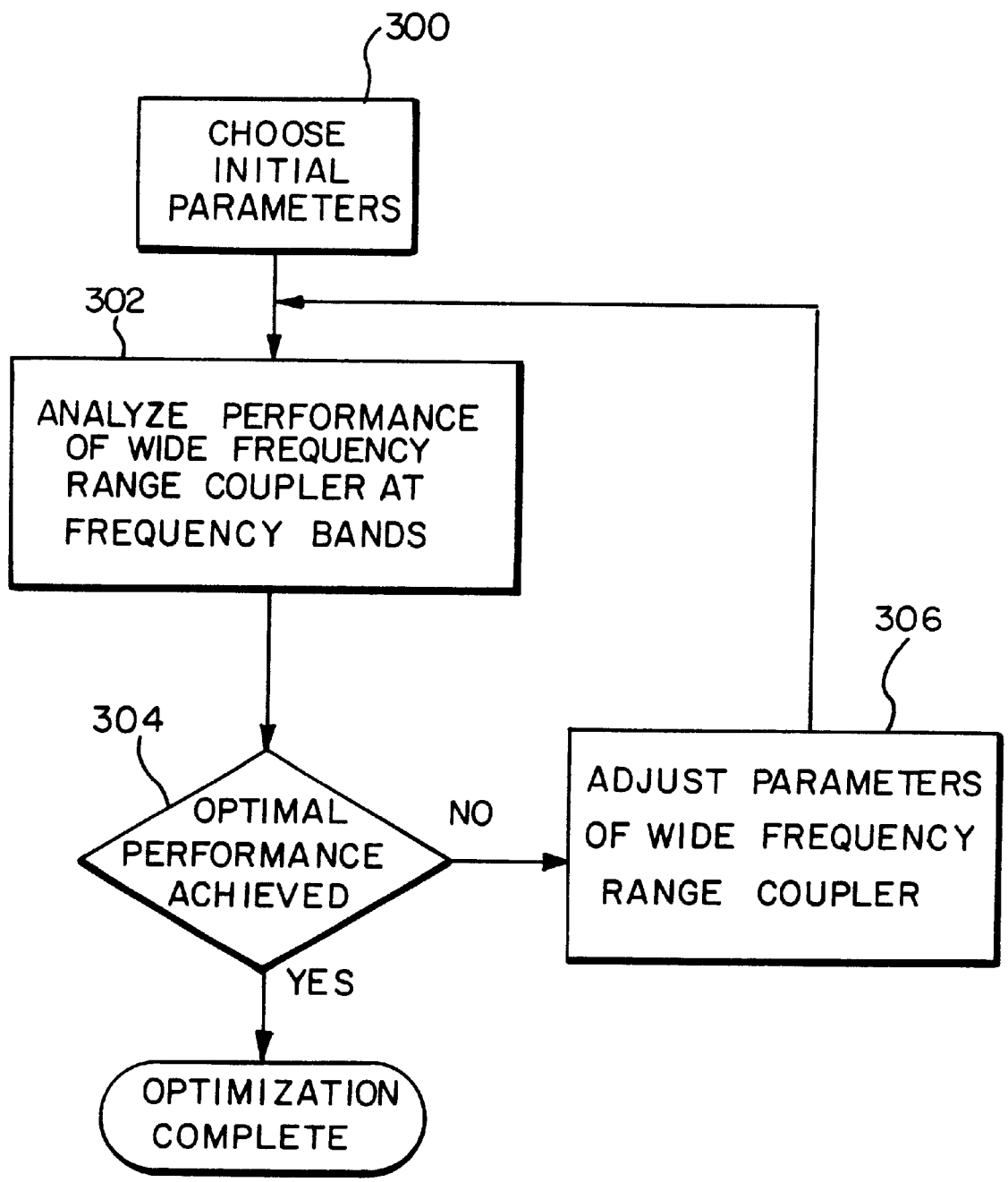
FIG. 3 is a flow chart illustrating the procedure of the present invention in setting the design parameters of the power detector to provide an optimal balance for measuring the transmitted power of the various possible transmission frequencies of the multiband phone.

In forming the wide frequency range power sensing device 34, the design parameters of the directional coupler 36 are adjusted to optimize the performance characteristics of the directional coupler 36 over the different possible transmission frequency bands of the multiband phone. The steps of this optimization process are set forth in flowchart form in FIG. 3. In step 300, the initial design parameters of the directional coupler 36 are selected. The performance of the directional coupler 36 is analyzed at each of the transmission frequency bands using the initial design parameters in step 302. In step 304, it is determined if the performance characteristics of the directional coupler 36 at each of the transmission frequency bands is within desired threshold limits for optimal transmission. For instance, it is determined if the forward signal coupling, the reverse signal isolation, and the insertion loss of the directional coupler 36 are all within acceptable threshold limits for optimal transmission. If so, the performance optimization of the directional coupler 36 for all transmission frequency bands is complete. If the performance characteristics of any of the transmission frequency bands using the initial design parameters are not satisfactory, then the design parameters of the directional coupler are adjusted in step 306. The design parameters which may be adjusted include, but are not limited to, the length of the conductive traces of the directional coupler, the width of the conductive traces, and the amount of overlap between the two conductive traces.

After one or many of the design parameters of the directional coupler 36 have been adjusted, the procedure returns to steps 304 and 306 where the performance characteristics of all of the transmission frequency bands are analyzed to determine if they are within the acceptable predetermined limits for optimal performance. If so, the optimization procedure is complete. If an optimal balance has not been achieved, then the procedure returns to step 306 where the design parameters are again adjusted. This loop of adjusting design parameters and subsequently analyzing the performance of the directional coupler 36 over all transmission frequency bands is continued until an optimal balance between the performance characteristics of all of the transmission frequency bands has been achieved. It is understood that this optimization procedure may be implemented using any number of possible transmission frequency bands.

In the embodiment of the present invention illustrated in FIG. 1, a voltage-to-current amplifier 46 is positioned between power amplifier controller 20 and switching device 22 in order to drive power amplifiers 12 and 14, which are current driven devices. Since most power amplifier controllers 20 can only control voltage controlled devices, voltage-to-current amplifier 46 is used to convert the voltage control signal from power amplifier controller 20 to a current control signal to be sent to power amplifiers 12 and 14. However, it is understood that voltage-to-current amplifier 46 may be omitted from the present invention 22 in those situations where power amplifiers 12 and 14 are voltage driven, so that power amplifier controller 20 is directly connected to the power amplifier switching device 22.

The implementation of the present invention will now be described with reference to particular transmission systems. This example is described merely for the purpose of illustration and does not encompass all possible types of transmission methods which may be used with the multiband power amplifier control system 10 of the present invention.

EXAMPLE 1

There are many types of transmission techniques currently being used for mobile telephones, where such digital transmission techniques include GSM (Global System for Mobile Communications) 900 and GSM 1800. GSM 900 operates at a frequency band of 900 MHz, while GSM 1800 operates at a frequency band of 1800 MHz. The multiband phone of the present invention could be designed to operate at both GSM 900 and GSM 1800 frequency bands. GSM 1800 has a bandwidth of 75 MHz as compared to 25 MHz for GSM 900, so that a GSM 1800 base station has three times the capacity of usable channels than GSM 900. However, the transmission distance of a GSM 1800 signal is much smaller than that of GSM 900, because the transmission frequency of GSM 1800 is twice that of GSM 900 and the power of the GSM 1800 transmitted signal is half that of GSM 900. Thus, a GSM 1800 base station covers a much smaller area than that of a GSM 900 base station.

Processing device 30 receives signals from the base stations of both GSM 900 and GSM 1800 systems in communication range with the multiband phone, where processing device 30 decides whether to transmit to a GSM 900 or GSM 1800 signal based upon the information about signal quality and strength it receives from the various base stations. In the situation where power amplifier 12 is designed to amplify a GSM 900 transmitted signal while power amplifier 14 is designed to amplify a GSM 1800 transmitted signal, switches 22 and 28 would be positioned as illustrated in FIG. 1 to interconnect the necessary components when processing device 30 decided to transmit a GSM 900 signal. A modulated signal 16, such as a Gaussian minimum shift-keying (GMSK) signal, would be fed through filter 17 and into power amplifier 12. Processing device 30 would instruct power amplifier controller 20 to control power amplifier 12 to amplify the power of signal 16 to the desired level for the base station communicated with the multiband telephone. The amplified signal 16 exiting power amplifier 12 is fed through lowpass filter 24, switching device 28, and power sensing device 34 to transmitting antenna 32 for transmission. The wide frequency range directional coupler 34 of power sensing device 34 branches off a portion of the signal 16 output by power amplifier 12 to wide frequency range power detector 38, where the actual power of the signal transmitted is measured. The measured power is fed back to power amplifier controller 20 through signal line 48, so that the power level of the amplified signal may be adjusted for any variations detected between the measured power and desired power of the transmitted signal.

During the next duty cycle, if processing device 30 determines that a GSM 1800 transmitted signal would provide a more optimal balance between signal strength and signal quality, then switching devices 22 and 28 are switched to establish their connection associated with power amplifier 14 to transmit a GSM 1800 signal during the next transmission period.

In this example, the wide frequency range power sensing device 34 will have design parameters which have been chosen as producing a balance in optimal performance characteristics between both the GSM 900 and GSM 1800 transmissions. The optimization procedure described in association with FIG. 3 will have been completed for the 900 MHz transmission band and the 1800 MHz transmission band.

As can be seen from the foregoing, a multiband phone having multiband power amplifier control formed in accordance with the present invention allows an optimal frequency band to be selected from a plurality of frequency bands as the transmission frequency for the transmitted signal based upon the strength and quality of the signal received at a base station. Moreover, by forming a multiband phone having a single wide frequency range power detector in accordance with the present invention, the size, cost, and complexity of the multiband phone can be minimized by reducing the number of components required to transmit a signal at multiple possible frequency bands. Furthermore, by forming a wide frequency range power detector whose design parameters are adjusted to provide the optimal balance for power detection between the various possible transmission frequencies in accordance with the present invention, a single power detector may accurately and efficiently measure the signal power over multiple possible transmission frequency bands regardless of which frequency band is selected for transmission.

In each of the above embodiments, the structures of the system for measuring and controlling the power of a signal transmitted from a multiband phone of the present invention are described separately in each of the embodiments. However, it is the full intention of the inventors of the present invention that the separate aspects of each embodiment described herein may be combined with the other embodiments described herein. Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A multiband phone capable of transmitting signals within multiple distinct frequency bands, where the phone selects a particular frequency at which to transmit the signal and the power of the selected transmission signal is measured and controlled, comprising:

a plurality of power amplifiers, each of the power amplifiers amplifying the power of a signal to be transmitted within a respective one of the multiple distinct frequency bands;

a single, wide frequency range power sensing device for measuring the power of a signal selected to be transmitted from any of the power amplifiers, wherein the amplified signal output by each of the plurality of power amplifiers is connected to the power sensing device;

a transmitting device connected to the output of the power sensing device for transmitting the signal selected to be transmitted; and a power detector switching device connected between the plurality of amplifiers and the power sensing device for switching the connection of the power sensing device between the plurality of power amplifiers so that the power sensing device is only connected to one of the plurality of power amplifiers at any time.

2. A multiband phone capable of transmitting signals within multiple distinct frequency bands, where the phone selects a particular frequency at which to transmit the signal and the power of the selected transmission signal is measured and controlled, comprising:

a plurality of power amplifiers, each of the power amplifiers amplifying the power of a signal to be transmitted within a respective one of the multiple distinct frequency bands;

a single, wide frequency range power sensing device for measuring the power of a signal selected to be transmitted from any of the power amplifiers, wherein the amplified signal output by each of the plurality of power amplifiers is connected to the power sensing device;

a transmitting device connected to the output of the power sensing device for transmitting the signal selected to be transmitted;

a power amplifier controller for controlling the amount of amplification performed by one of said plurality of power amplifiers; and a switching device connected to said power amplifier controller for switching the connection of said power amplifier controller between said plurality of power amplifiers such that the power amplifier controller is coupled to only one of the power amplifiers at a time so that said power amplifier controller only controls one of said power amplifiers at a time.

3. The multiband phone of claim 2, further comprising a processing device for monitoring the quality and strength of a received signal and instructing said switching device to switch its connection between respective ones of said plurality of power amplifiers based upon a determination of which of said multiple distinct frequency bands provides an optimal balance between signal quality and signal strength.

4. The multiband phone of claim 3, wherein said processing device includes a stored predetermined relationship between signal strength and a voltage driving said plurality of power amplifiers; said processing device further instructing said power amplifier controller to adjust the voltage driving said plurality of power amplifiers according to the desired signal strength.

5. The multiband phone of claim 4, further comprising a feedback loop connected to said power sensing device for communicating the power measured by said power detector back to said power amplifier controller, wherein said power amplifier controller adjusts the voltage driving the power amplifier connected thereto based upon a difference between the desired power output by the connected power amplifier and the measured power output by the connected power amplifier fed back to said power amplifier controller.

6. The multiband phone of claim 2, wherein said single, wide frequency range power sensing device includes:
 a wide frequency range directional coupler positioned along a transmission path of the transmission signal passing through said power detector; and
 a wide frequency range power detector operably connected to said directional coupler;
 wherein said directional coupler couples the transmission signal to said power detector so as to substantially allow only signals traveling in the direction toward the transmission device to be passed through said power detector.

7. The multiband phone of claim 6, wherein said directional coupler is formed having design parameters matched with said multiple distinct transmission frequency bands to provide a desired balance of performance characteristics over all of said multiple distinct transmission frequency bands.

8. A wide frequency range power detecting device for measuring the power of a signal transmitted from a multiband phone capable of transmitting signals within multiple distinct frequency bands, comprising:
 a wide frequency range directional coupler positioned in a transmission path of a signal to be transmitted;
 a wide frequency range power detector connected to said directional coupler for measuring the power of the signal to be transmitted; and
 a switching device connected to said directional coupler and further including a plurality of inputs; each of said inputs connected to receive a signal from a respective one of a plurality of power amplifiers; said switching device operable to switch the connection of said directional coupler between respective ones of said inputs to operably connect said directional coupler to receive the signal from the respective one of a plurality of power amplifiers.

9. The wide frequency range power detecting device of claim 8, wherein said directional coupler couples the signal selected to be transmitted to said power detector, said directional coupler substantially allowing only signals traveling in the direction of the transmission path to be passed through to said power detector.

10. The wide frequency range power detecting device of claim 9, further comprising a resistor operably connecting said directional coupler to ground, said directional coupler preventing undesirable signals from entering said power detector by transmitting any undesirable signals traveling in an opposite direction to the transmission path through said resistor to be dissipated.

11. The wide frequency range power detecting device of claim 8, wherein said directional coupler is formed having design parameters matched with said multiple distinct transmission frequency bands to provide a desired balance of performance characteristics over all of said multiple distinct transmission frequency bands.

12. A method of forming a wide frequency range power detecting device for use in a multiband telephone capable of transmitting signals within a plurality of distinct frequency bands, the wide frequency range power detecting device having design parameters that provide desired performance characteristics for detecting the power of a transmitted signal over each of the distinct frequency bands, comprising the steps of:
 selecting initial design parameters for the power detecting device;
 analyzing the performance of the power detecting device at each of the distinct frequency bands using the initial design parameters to determine if the power detecting device is operating with predetermined performance characteristics in each of the distinct frequency bands;
 adjusting the design parameters of the power detecting device until the performance of the power detecting device operates with the predetermined performance characteristics over all of said plurality of distinct frequency bands,
 wherein the power detector includes a directional coupler having a first conductive trace coupled to at least two power amplifiers residing in a multiband power amplifier and configured to transmit a first signal having a first bandwidth and configured to transmit a second signal having a second bandwidth different from the first bandwidth, and having a second conductive trace coupled to a power measuring device that provides an indication of the signal power to be transmitted;
 wherein the design parameters of the power detector which are adjusted include at least one of a length of the first conductive trace, a width of the first conductive trace, and an amount of overlap between the first conductive trace and the second conductive trace.

13. The method of forming a wide frequency range power detecting device of claim 12, wherein the performance characteristics analyzed include the insertion loss of the directional coupler.

14. The method of forming a wide frequency range power detecting device of claim 12, wherein the performance characteristics analyzed include the amount of isolation provided by the directional coupler.

15. The multiband phone of claim 7, wherein the directional coupler is formed of a first conductive trace coupled to the power detector switching device and a second conductive trace coupled to a power detector, wherein the first conductive trace is sensitive to transmission frequencies associated for each one of the plurality of power amplifiers.

16. The method of claim 12, wherein the directional coupler is formed of the first conductive trace coupled to a power detector switching device such that the first conductive trace is sensitive to each one of a plurality of transmission frequencies associated with each one of the plurality of distinct frequency bands.

17. The multiband phone of claim 2, further comprising a power detector switching device connected between the plurality of power amplifiers and the power sensing device for switching the connection of the power sensing device between the plurality of power amplifiers so that the power sensing device is only connected to one of the plurality of power amplifiers at any time.

* * * * *